United States Patent [19]
Alers et al.

[11] Patent Number: 6,043,662
[45] Date of Patent: Mar. 28, 2000

[54] DETECTING DEFECTS IN INTEGRATED CIRCUITS

[76] Inventors: Glenn Baldwin Alers, 1771 Redwood Dr., Santa Cruz, Calif. 95054; Kathleen Susan Krisch, 344 Livingston Ave., New Providence, N.J. 07974; Bonnie Elaine Weir, 18 Midland Ave., Bronxville, N.Y. 10708

[21] Appl. No.: 09/002,497

[22] Filed: Jan. 2, 1998

Related U.S. Application Data

[63] Continuation-in-part of application No. 08/718,113, Sep. 18, 1996, Pat. No. 5,804,975.

[51] Int. Cl.[7] ................................................ G01R 31/26
[52] U.S. Cl. .......................... 324/520; 324/765; 324/613
[58] Field of Search .................................. 324/613, 520, 324/769, 765

[56] References Cited

U.S. PATENT DOCUMENTS

| | | | |
|---|---|---|---|
| 5,049,811 | 9/1991 | Dreyer | 324/613 |
| 5,057,441 | 10/1991 | Gutt | 324/719 |
| 5,252,497 | 10/1993 | Idler | 324/613 |
| 5,598,102 | 1/1997 | Smayling | 324/537 |
| 5,804,975 | 9/1998 | Alers | 324/613 |

OTHER PUBLICATIONS

J.M. Soden et al., "Identifying Defects in Deep–Submicron CMOS ICs", Sep. 1996, pp. 66–71, IEEE Spectrum.

*Primary Examiner*—Josie Ballato
*Assistant Examiner*—Jose M. Solis

[57] ABSTRACT

The breakdown of an ultra-thin dielectric layer is detected by applying a test signal to the layer. Measurements are taken of noise signals present in the layer during the application of the test signal. At breakdown, a significant increase occurs in the amplitude of the measured noise signals. Similarly, fluctuations in quiescent current, $I_{DDQ}$, ($I_{DDQ}$ noise signals), rather than the values of $I_{DDQ}$, are utilized during testing as the basis for detecting defects in integrated circuits.

11 Claims, 2 Drawing Sheets

DETECTING DEFECTS IN INTEGRATED CIRCUITS

REFERENCE TO CO-PENDING APPLICATION

This is a continuation-in-part of commonly assigned application Ser. No. 08/718,113, filed Sep. 18, 1996, now U.S. Pat. No. 5,804,975, issued Sep. 8, 1998.

BACKGROUND OF THE INVENTION

This invention relates to electronic structures such as devices, test structures and integrated circuits and, more particularly, to testing such components to measure certain characteristics thereof or to determine whether or not they contain defects.

In practice, a variety of well-known techniques are commonly utilized during or subsequent to manufacture to measure certain characteristics of devices, test structures and integrated circuits or to detect defects therein. As, however, the trend toward smaller feature sizes and faster, denser components continues, the capability of these known testing procedures is in many cases severely strained.

Often, for example, it is too time consuming, or even impossible, to perform full functional testing on a very-large-scale integrated circuit, and so instead simpler screening tests are used to distinguish good circuits from circuits with defects or failures. By way of example, this difficulty is illustrated in practice by tests designed to detect breakdown in ultra-thin dielectric layers or by tests designed to measure $I_{DDQ}$ [which is the current that flows quiescently from the power source ($V_{DD}$) of a circuit to ground.] In the course of such testing of particular circuits, devices or structural features, it may be difficult or even impossible to detect a difference between fault-free and defective structures or circuits. In other words, the current or voltage measured during a particular test on a failed structure may be virtually indistinguishable from the corresponding quantity of a good structure. The reason for this is that while the failed region may have a larger current density flowing through it than an equivalent intact and good region, the good region covers much more area, so that, collectively, the total current in the good region is larger, and the characteristic behavior of the failed region is obscured. This becomes an increasing problem for sub-micron-scaled integrated circuits, in which the off-current densities and leakage-current densities are larger than in previous generations of circuits.

Dielectric layers constitute vital elements of a wide variety of electronic components. Thus, for example, silicon dioxide is commonly utilized to form the so-called gate oxide layer of typical metal-oxide-semiconductor (MOS) transistor devices included in an integrated circuit made on a multi-chip wafer. For some high-performance MOS devices, the thickness of the dielectric gate layers may have to be exceedingly small [for instance, only about six nanometers (nm) or less].

Fabricating ultra-thin dielectric layers that meet specified operating criteria is a challenging task. This is particularly true when a large-area dielectric layer must be formed on the entirety of the surface of a wafer or other substrate on which multiple devices are to be made in a batch-fabrication sequence. To minimize the chances that such devices will fail during actual operation, it is advantageous to measure certain characteristics of the dielectric layers of the devices either at some intermediate point in the fabrication sequence or at least before shipping the devices to a customer.

Determining the point at which a dielectric layer breaks down or determining the fraction of devices whose dielectric layers show early breakdown are important ways of assessing the quality of the layer. An actual device or wafer (or a test device or wafer) whose dielectric layer fails to exhibit a prespecified breakdown characteristic would, of course, be rejected for use or utilized as a basis for modifying the fabrication sequence.

As a specific illustrative example, for relatively thick dielectric gate layers (thicker than say about six nm), the breakdown characteristic can usually be adequately measured by any one of a number of standard techniques. Thus, for instance, a voltage applied across such a layer can be periodically ramped up to successively higher values while measuring current flow through the layer. At breakdown, a substantial increase in current flow occurs. In another standard technique, the current through the layer is regularly increased while measuring the voltage across the layer. At breakdown, a substantial decrease occurs in the voltage across the layer. In yet other approaches, either a constant current or a constant voltage is maintained through or across the layer until and subsequent to breakdown. At breakdown, either the voltage decreases (for the constant-current case) or the current increases (for the constant-voltage case). In another early-breakdown screening technique, a voltage higher than some specified operating value is momentarily applied across the layer and the current therethrough is measured. If the current does not exceed a prespecified value, the layer is determined to have not suffered breakdown.

For all of the aforementioned standard testing techniques, distinguishing between the pre-breakdown and breakdown states of a dielectric layer becomes increasingly difficult as the layer gets thinner. Thus, for example, for a silicon oxide layer thinner than about six nm or less, the absolute value of the current through or the voltage across the layer at breakdown may not be statistically different from the corresponding quantity that is measured before breakdown. In such cases, a reliable determination of the breakdown characteristic of the layer being tested is very difficult or even impossible.

In the aforementioned $I_{DDQ}$ technique for testing integrated circuits, the current, $I_{DDQ}$, that flows quiescently from $V_{DD}$ to ground through a fault-free circuit is measured. This is done, for example, as a voltage $V_{DD}$ is successively applied to some or all of the power pins of a circuit as different signal voltages are applied, in different sequences, to some or all of the signal pins of the circuit. Each different set of signal conditions applied to the chip is commonly referred to as a test vector. Another realization of the $I_{DDQ}$ technique comprises, for example, ramping the power supply voltage from zero to $V_{DD}$.

For each good circuit being tested, $I_{DDQ}$ has a characteristic value or waveform, which may be distinct for each different test vector. As heretofore practised, $I_{DDQ}$ testing relies on the fact that the value of $I_{DDQ}$ or its waveform in a good circuit will differ in an easily distinguishable way from those in a defective circuit or that certain defects will cause an elevated $I_{DDQ}$ current. But, as dielectric layers are scaled down in size and/or as other feature sizes of the circuits are significantly reduced, the value or waveform of $I_{DDQ}$ in a defect-containing circuit is often indistinguishable in practice from the $I_{DDQ}$ of a corresponding defect-free circuit.

Various suggestions have been proposed for enhancing the reliability of $I_{DDQ}$ testing as applied to small-feature-size integrated circuits. Thus, for example, on-chip test and sensing circuits designed to measure $I_{DDQ}$ for just a portion of a chip at a time may extend the utility of the $I_{DDQ}$ technique. But this modification can interfere with overall circuit performance and require excessive chip area. Also, proposals have been made to modify the manufacturing technology or the design rules in a way to prevent high nominal values of $I_{DDQ}$. But such proposals often interfere unacceptably with process and circuit optimization. Further suggestions have been made to measure $I_{DDQ}$ at ultra-low temperatures. But such measurements may not modify the value or waveform of $I_{DDQ}$ in a fault-containing circuit in a predictable and consistent manner.

Accordingly, continuing efforts have been directed by workers skilled in the art aimed at trying to devise other ways of measuring breakdown in very thin dielectric layers and other ways of carrying out $I_{DDQ}$ testing in small-feature-size integrated circuits. It was recognized that such efforts, if successful, would make possible, or at least facilitate, accurate testing of such layers to detect the occurrence of breakdown therein and would also extend the applicability of $I_{DDQ}$ testing to small-feature-size integrated circuits. In turn, this would provide, for example, a basis for insuring that the breakdown characteristics of very thin dielectric layers included in high-performance devices could be reliably tested and, further, that small-feature-size integrated circuits could be reliably tested by $I_{DDQ}$ techniques. As a result, the manufacturing yield, cost and long-term operating properties of such devices and circuits could thereby be significantly improved.

SUMMARY OF THE INVENTION

In accordance with one aspect of the principles of the present invention, current or voltage fluctuations (noise signals) that occur in a dielectric layer in response to applied test signals are utilized as a basis for determining the breakdown status of the layer. At breakdown, especially in ultra-thin layers, a significant increase occurs in the magnitude of the measured noise signals.

In further accord with the invention, fluctuations (noise) in $I_{DDQ}$, rather than the absolute value of $I_{DDQ}$, are utilized as the basis for detecting defects in an integrated circuit.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

First, testing of a thin dielectric layer in accordance with the invention will be described. Thereafter, a unique version of $I_{DDQ}$ testing that embodies the principles of the present invention will be set forth.

Herein, for purposes of a specific illustrative example, the thin dielectric layer to be tested will be assumed to be a conventional layer made of thermally grown silicon dioxide which constitutes the gate oxide of a standard MOS device. Illustratively, multiple such devices are included on an integrated-circuit chip. In turn, multiple such chips are included on a wafer, as is well known in the art. It is also well known that the long-term reliability of such a device is critically dependent on the gate oxide layer thereof exhibiting a breakdown characteristic that meets some prespecified standard.

Figure 1:
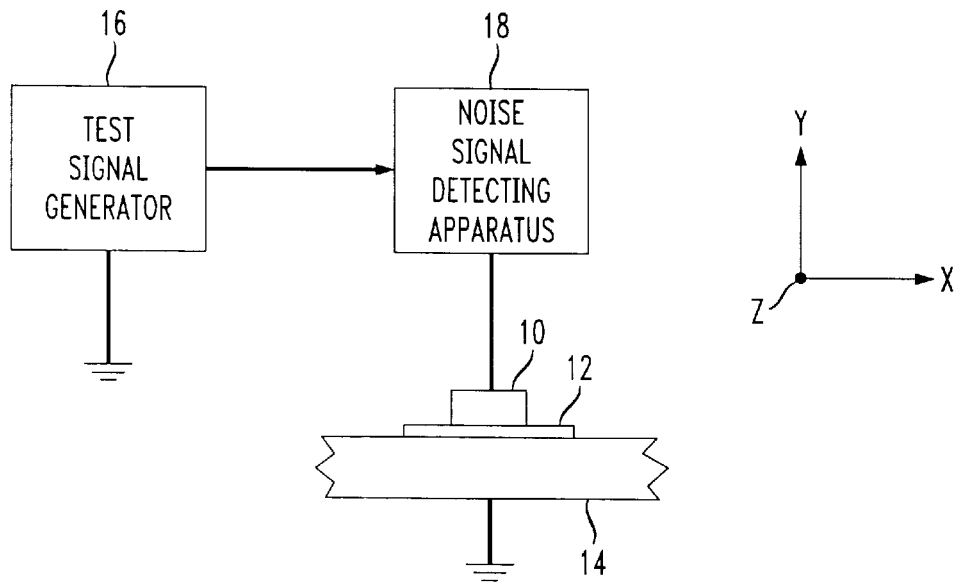
FIG. 1 is a simplified depiction of apparatus that is adapted to test a dielectric layer for breakdown in accordance with the principles of the present invention.

By way of a particular example, FIG. 1 shows a conventional gate electrode 10 that has been formed on a dielectric gate layer 12 in accordance with standard integrated-circuit fabrication techniques. Herein, the layer 12 will be assumed, for illustrative purposes, to be a dielectric layer having a Y-direction thickness of about three nm. In turn, the layer 12 is shown formed on a portion of the top surface of a conventional silicon wafer 14.

In practice, it is usually advantageous to make multiple MOS devices each including a gate structure on the wafer 14 of FIG. 1 in a standard batch-fabrication procedure. In such a case, defects in the layer 12 could deleteriously affect the breakdown properties, and thus the performance, of the entire batch of devices. For this reason, it is common practice during fabrication to test one or more of the devices being made, or to evaluate test structures formed on the wafer between actual devices, as a basis for sampling the quality of the dielectric gate layer.

In accordance with the present invention, testing of the dielectric layer 12 of FIG. 1 is carried out by applying a test signal thereto. Illustratively, this is done by connecting a test signal generator 16 to the gate electrode 10 via an apparatus 18 which is described below. (Additionally, both the generator 16 and the bottom surface of the wafer 14 are connected to a point of reference potential such as ground.) The test signal can be a ramped current, a ramped voltage, a constant current applied until and subsequent to breakdown, a constant voltage applied until and subsequent to breakdown, or a momentarily applied voltage or current.

FIG. 1 further includes detecting apparatus 18 which is also connected to the gate electrode 10. Illustratively, the apparatus 18 comprises conventional signal detecting and processing equipment. In accordance with the invention, the apparatus 18 is adapted to measure the current or voltage noise signals that occur in the gate layer 12 while test signals are being applied thereto. As described in detail below, these noise signals have been found to be a decisive indicator of whether or not the layer 12 is in its pre-breakdown condition or actually broken down.

Prior to breakdown, Y-direction current flow (mainly tunneling current) through the layer 12 of FIG. 1 may be considered to occur in a substantially evenly distributed way through the cross-sectional extent of the layer via a multiplicity of parallel-disposed small-volume elements of the layer 12.

In practice, when breakdown occurs in the layer 12 of FIG. 1, a small-volume region of the layer assumes a relatively low-impedance condition. As a result, at breakdown substantially all the current flow through the layer is then limited to that small-volume region.

Especially for an ultra-thin dielectric layer, the increase in the absolute value of current flow through the layer that occurs at breakdown can be small or virtually non-existent relative to the value of pre-breakdown current. Accordingly, even though at breakdown the total current flow switches in effect from flowing through the volume of the layer to flowing through a small-volume region thereof, an external detector sensitive only to the absolute value of the total current flow may not be able easily, or at all, to detect the occurrence of the breakdown phenomenon.

In accordance with the principles of the present invention, fluctuations in (rather than the absolute value) of the current through or the voltage across the layer 12 of FIG. 1 are monitored. Even for an ultra-thin layer, these current or voltage fluctuations, which in effect constitute noise signals in the layer 12, have been found to be a reliable and easily detected indicator of whether the layer is in its pre-breakdown state or broken down. By this technique, accurate detection of breakdown in a dielectric layer, particularly in an ultra-thin layer, is significantly facilitated.

Conditions that produce noise signals are inevitably present in a dielectric material such as that of the layer 12 of FIG. 1. These conditions, which occur randomly throughout the volume of the layer both before and after breakdown, constitute dynamic events that vary with time, as is well known in the art.

Figure 2:
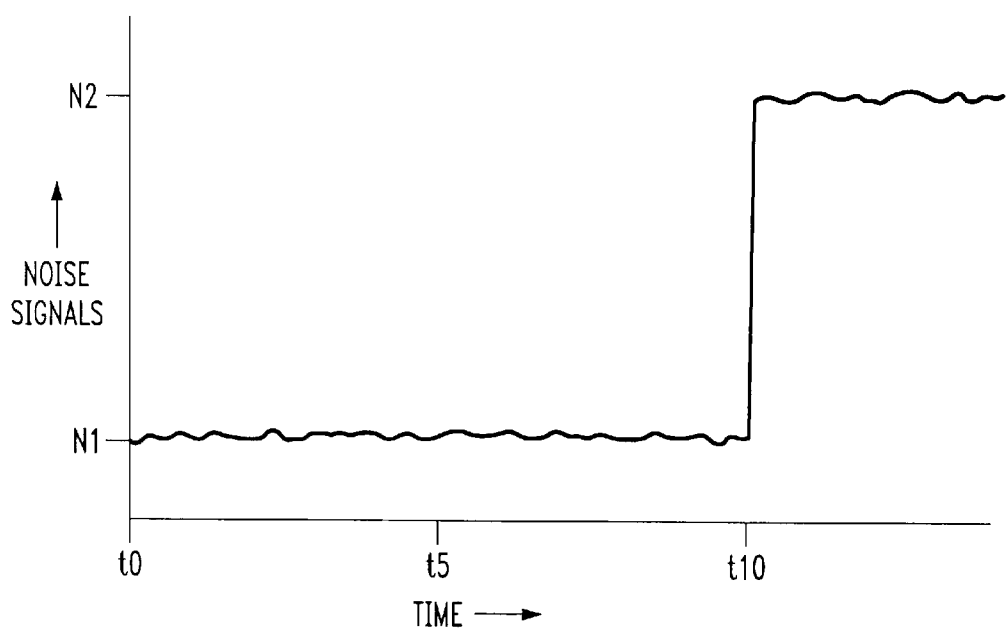
FIG. 2 is a graphical representation of the change in noise signal that is detected by the FIG. 1 apparatus to occur in the layer at breakdown.

For the purpose of a specific example, FIG. 2 graphically represents an illustrative case in which a constant-voltage test signal is applied over an extended period of time to a three-nm-thick layer 12 (FIG. 1) from the generator 16. In time, the layer breaks down, in a well known manner. In FIG. 2, breakdown is shown as occurring at time t10. In one particular example, t10 occurs about 4600 seconds after first applying a direct-current constant voltage of about five volts across the layer 12.

Illustratively, at multiple spaced-apart intervals along the time axis of FIG. 2, plural readings of the tunneling current flowing through the layer 12 of FIG. 1 are taken by the detecting apparatus 18. By way of example, a set of 128 such readings are periodically taken at eight-second intervals. The plural readings in each set are spaced apart, for example, by 0.0625 seconds. Thus, for the particular case in which t10 occurs at about 4600 seconds, a total of 575 sets of readings, each set including 128 measurements, would be taken.

Assume, for an illustrative example, that starting at time t5 of FIG. 2 during the pre-breakdown state of the layer 12, an intermediate one of the aforespecified sets of current readings is to be taken. Assume further that the set starting at t5 includes 128 such current readings each taken at eight-second intervals. These readings respectively constitute the absolute values of the currents that flow through the entire X-Z-plane cross-section of the layer 12 at these respective times.

In accordance with the invention, the set of 128 absolute values of the current flow measured at spaced intervals starting at t5 of FIG. 2 are processed in straightforward ways by the apparatus 18 of FIG. 1 to obtain a calculated value indicative of the fluctuations of the measured set of values. This calculated value is then in effect representative of the amplitude of the noise signal in the layer 12 during the measurement interval.

The aforementioned noise-representative signal may be derived from the measured absolute current values by any one of a number of standard techniques. Thus, for example, the noted current fluctuations may be calculated by obtaining the variance, the standard deviation or the Fourier transform of each set of current measurements. By way of a specific illustrative example, each set of current measurements will be assumed to be processed by the apparatus 18 of FIG. 1 to obtain the variance of the measured current values.

The standard procedure implemented by the apparatus 18 of FIG. 1 to calculate the variance of each set of current measurements involves initially determining the average of each set of measured absolute current values. Then, in the apparatus 18, each individual absolute-current measurement is subtracted from that average to obtain a difference value (which may be positive or negative). Subsequently, each difference is squared. Next, the squared differences are summed. The sum is then divided by the number of measurements. The resulting quantity constitutes the variance of the measurements.

Importantly, the value of each individual variance calculated as specified above is proportional to the current fluctuations or perturbations that occur in the layer 12 during each measurement interval. In effect, each variance value is thus representative of the amplitude of noise signals present in the layer during measurement.

The aforespecified individual variance values are plotted in FIG. 2. In the pre-breakdown period, in the time interval from t0 to t10, these values are in practice relatively small and approximately equal to each other. The slightly varying nature of the plot of such values in the interval t0-to-t10 is indicative of the fact that noise is a dynamic phenomenon and varies slightly from test interval to test interval as the multiple sets of current readings are being taken.

In the pre-breakdown period (t0-to-t10 in FIG. 2), randomly distributed and dynamically changing phenomena in the layer 12 of FIG. 1 may cause the relatively small current flowing through each small-volume element of the layer to be increased or decreased slightly from a nominal value of current. Thus, for each volume element, each of the measured currents will be equal to the nominal value, less than the nominal value, or greater than the nominal value. Overall, these current fluctuations in the multiple volume elements tend on average at any instant of time to substantially cancel each other out. Hence, the net total current fluctuation that is measured by the apparatus 18 as occurring in the volume of the layer 12 during each measurement interval in the pre-breakdown state tends to be significantly smaller than in the post-breakdown state. In FIG. 2, the nominal amplitude of these successively calculated small noise-representative signals is indicated on the Y axis by the designation N1.

At breakdown, at t10 in FIG. 2, substantially all of the current through the layer 12 of FIG. 1 flows through a limited-volume region thereof. As specified earlier above, for a three-nm-thick layer, breakdown typically occurs in a volume element whose X-Z-plane cross-sectional area has a small diameter. This large concentration of the total current flow in a limited volume of the layer 12 is the reason that the detected noise signal increases to a relatively large value (N2 in FIG. 2) at breakdown.

Any noise-producing perturbing phenomena that occur in the limited-volume region of the layer 12 at breakdown are not substantially averaged out in the way that multiple distributed fluctuations in effect cancel each other out in the volume of the overall layer before breakdown. Thus, at breakdown, the net effect of any perturbation in the small-volume region acting on substantially the totality of the current flowing through the layer is to produce an extremely large fluctuation in the total current flow therethrough. In practice, in one illustrative example, the amplitude of this fluctuation or noise-representative signal, indicated as N2 in FIG. 2, is, for example, about seven orders of magnitude greater than the corresponding signal calculated before breakdown.

Thus, in accordance with one aspect of the principles of the present invention, a unique and simple way of accurately detecting breakdown in dielectric layers is provided. By taking advantage of the fact that the amplitude of noise signals in such a layer is inversely related to the cross-sectional area through which the current flows, the detection of the onset of breakdown, especially in ultra-thin layers, is significantly facilitated. Such detection can advantageously be utilized in combination with conventional breakdown-detection techniques.

Additionally, as mentioned earlier above, $I_{DDQ}$ testing is a known technique that is often utilized to determine whether or not an integrated circuit contains defects such as gate-oxide faults, metal bridging, leaky p-n junctions and some forms of open-circuit defects. By way of example, $I_{DDQ}$ testing of complementary MOS (CMOS) circuits is described in an article entitled "Identifying Defects in Deep-Submicron CMOS ICs" by J. M. Soden et al, *IEEE Spectrum,* September 1996, pages 66–71.

As previously indicated, $I_{DDQ}$ testing of integrated circuits has some shortcomings as feature sizes and dielectric layer thicknesses decrease. In such cases, it is often difficult or impossible to utilize $I_{DDQ}$ techniques to distinguish adequately between good and bad circuits. In particular, the absolute value of $I_{DDQ}$ or the waveform of $I_{DDQ}$ in a defective circuit is often indistinguishable from the corresponding value or waveform in a fault-free circuit.

In accordance with the principles of the present invention, conventional $I_{DDQ}$ testing techniques are modified and enhanced in a significant and unique way, particularly as applied to the testing of small-feature size integrated circuits. A specific illustrative interconnection of components to carry out such modified-$I_{DDQ}$ testing in accordance with the invention is represented in FIG. 3.

Figure 3:
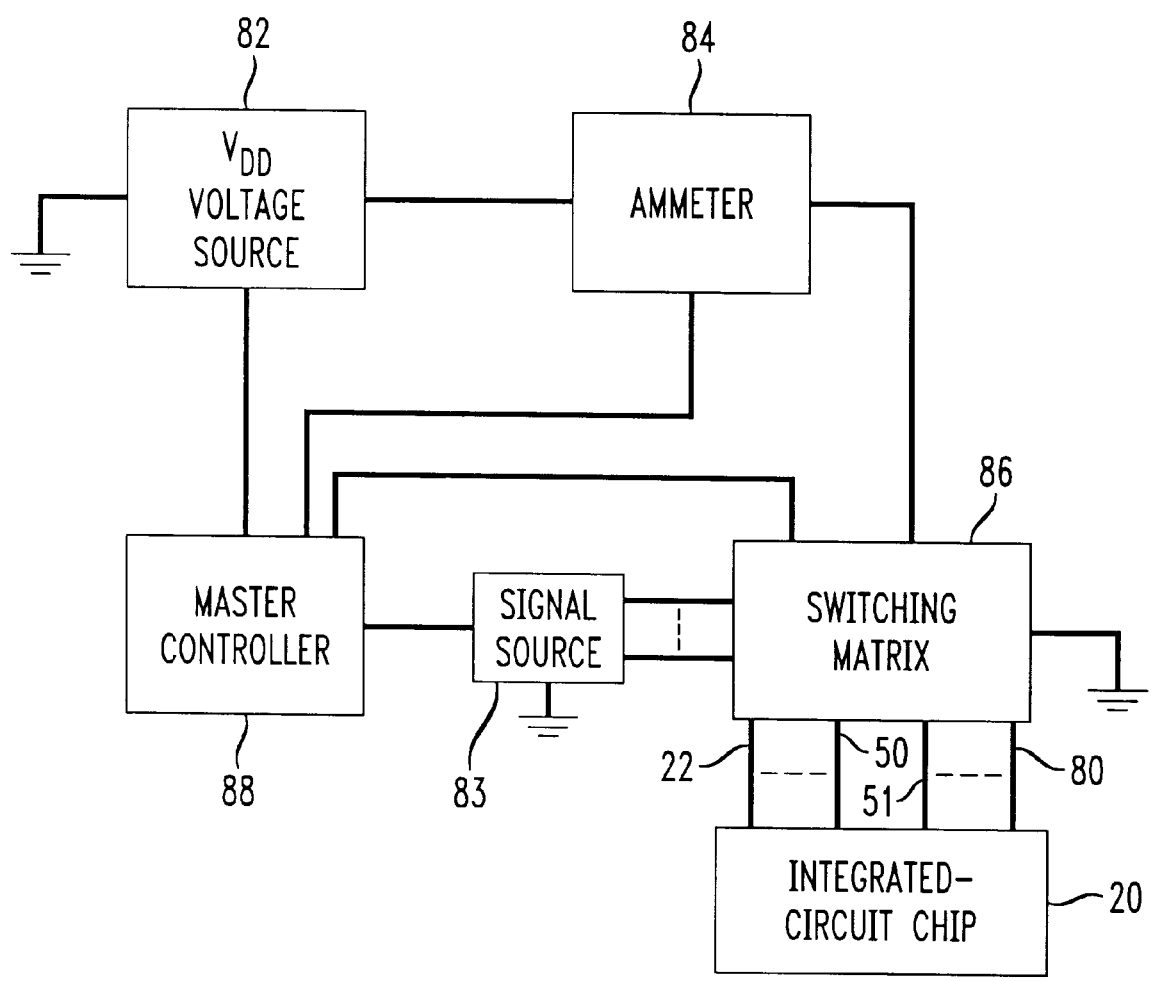
FIG. 3 is a simplified depiction of apparatus made in accordance with the invention and designed to perform $I_{DDQ}$ testing on an integrated circuit.

By way of a specific illustrative example, the FIG. 3 arrangement is adapted to test an integrated-circuit chip 20 to determine whether or not it contains defects. As schematically represented in FIG. 3 by leads 22 ... 50, the chip 20 contains multiple input pins which are respectively designed to be connected to a voltage source $V_{DD}$ or to a point of reference potential such as ground. Additionally, the chip 20 contains multiple signal input and output pins 51 ... 80.

$V_{DD}$, supplied by a conventional source 82 (FIG. 3), comprises a direct-current source of voltage having a value, for example, of about five volts. Quiescently, that is, when the chip 20 is in its ON or operating state, some current, $I_{DDQ}$, flows from the source 82 to the chip 20 and then to ground, as is well known. The value of this current is measured by an ammeter 84.

FIG. 3 also includes a standard switching matrix 86 which, in response to control signals applied thereto from a conventional master controller 88, is designed to connect some or all of the power pins of the chip 20 to the source 82 via the ammeter 84 and to connect selected ones of them to ground. Additionally, the matrix 86 is designed, in response to signals from the controller 88, to connect some or all of the signal pins 51 ... 80 of the chip 20 to a conventional signal source 83. As indicated in FIG. 3, the controller 88 is also connected to the source 82.

Illustratively, the controller 88 of FIG. 3 is commonly programmed such that the full value of $V_{DD}$ supplied by the source 82 is simultaneously applied via the matrix 86 to all (the full set) or some of the power pins of the chip 20. In this mode, various signal combinations (test vectors) are then successively applied to the chip 20 and respective values of $I_{DDQ}$ are measured by the ammeter 84.

To carry out another form of $I_{DDQ}$ testing of the chip 20 of FIG. 3, the $V_{DD}$ source 82 may, in response to control signals from the controller 88, be ramped up in value from zero to its final value of $V_{DD}$. This particular mode of $I_{DDQ}$ testing is specified in the aforecited article by Soden et al. In this mode, the ramped-up $V_{DD}$ is applied via the matrix 86 to some or all of the power pins of the chip 20.

For each of the aforedescribed $I_{DDQ}$ testing modes, the ammeter 84 of FIG. 3 indicates an absolute value of $I_{DDQ}$ or successive values thereof. In turn, the master controller 88 monitors these indicated absolute values and compares them, for each given test vector, to corresponding stored quantities that are characteristic of a known defect-free version of the chip 20. In that way, conventional $I_{DDQ}$ testing of the chip 20 is carried out. But, as mentioned earlier above, as the feature size of the chip 20 decreases, it has in practice become increasingly difficult, if not impossible, to reliably distinguish between the corresponding absolute $I_{DDQ}$ values for fault-free and defective chips.

In accordance with the principles of the present invention, fluctuations in $I_{DDQ}$, rather than absolute values of $I_{DDQ}$, are utilized as the basis for testing devices, chips, wafers, etc. These fluctuations in $I_{DDQ}$ (which constitute $I_{DDQ}$ noise signals) have been determined to be a reliable indicator of the occurrence of anomalous conduction events (faults). This is so because in practice a wide variety of defects tend to occur in a highly localized manner. And, as described in detail earlier above for the dielectric-layer-breakdown case, while electrical noise is proportional to the current going through a region, it is inversely proportional to the area through which the current flows. Thus, even if the magnitude of the defect current is of the same order of magnitude as the nominal current, the noise contribution (fluctuations in $I_{DDQ}$) will be substantially larger. This significant and unique recognition makes detection of anomalous conduction events extremely reliable even for small-feature-size chips.

Thus, in accordance with the invention, $I_{DDQ}$ testing is carried out by determining fluctuations in $I_{DDQ}$. These fluctuations or noise signals are calculated by the master controller 88 based on readings of absolute values of $I_{DDQ}$ registered on the ammeter 84. Illustratively, such determination of noise is carried out by the controller 88 in exactly the same manner described in detail above for the dielectric-layer-breakdown case. Thus, for example, for each particular test condition, multiple absolute values of $I_{DDQ}$ are measured and then processed by the controller 88 to obtain a variance of the measurements. Alternatively, a conventional spectrum analyzer can be used to directly or indirectly measure the voltage or current noise.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, although emphasis above was directed to an illustrative example utilizing variances, it is often advantageous to subtract a linear or smooth function from the measured value before calculating the variance. And even more thorough noise analysis (in the dielectric-layer-breakdown case or in the $I_{DDQ}$ case) can be performed employing conventional Fourier analysis. Also, the techniques described herein can be applied to individual dielectric layers made of a wide variety of materials (such as, for example, silicon nitride) or to multi-layer dielectric stacks. Further, the invention is applicable to testing dielectric layers included in an assortment of elements and devices other than MOS devices. And, more generally, the principles of the present invention are to be understood to be applicable to various other techniques wherein, because of scaling or other factors, it is difficult during testing to distinguish between current and/or voltage measurements on defect-free and faulty devices. In such cases, the testing procedure can often be significantly enhanced by measuring the noise, rather than the absolute value of, particular monitored parameters. Additionally, these techniques are also applicable to characterizing the defects or lifetimes of metal layers used, for example, for interconnections in integrated circuits or electronic packages.

What is claimed is:

1. A method of testing a multi-pin integrated-circuit chip, said method comprising the steps of applying a voltage source($V_{DD}$), ground and signals to some or all of the pins of said circuit during a quiescent test period to produce a current flow, $I_{DDQ}$, through said circuit, successively measuring the values of $I_{DDQ}$ that flow through said circuit during the test period, processing said measured values to determine the amplitude of noise signals in said measured values and rejecting said chip being tested if the noise signal exceeds a predetermined amplitude.

2. A method as in claim 1 wherein said processing step comprises taking successive sets of readings of the values of $I_{DDQ}$ at spaced-apart intervals of time and calculating a noise-representative signal from each such set of readings.

3. A method as in claim 2 further comprising calculating the variance of each set of readings.

4. A method as in claim 3 still further comprising subtracting a smooth function from each set of readings before calculating the variance.

5. Apparatus for detecting defects in an integrated circuit, said apparatus comprising means for applying a voltage source ($V_{DD}$), ground and signals to said circuit during a quiescent test period to produce a current flow, $I_{DDQ}$, through said circuit, means for successively measuring the values of $I_{DDQ}$ that flow through said circuit during the test period, and a master controller responsive to said measured values of $I_{DDQ}$ for calculating the amplitude of noise signals in said measured values.

6. Apparatus as in claim 5 wherein said integrated circuit to be tested comprises multiple power, ground and signal pins, said apparatus further including a switching matrix interposed between said pins and said means for applying $V_{DD}$, ground and signals to said circuit.

7. Apparatus as in claim 6 wherein said master controller is connected to said means for applying and also connected to said matrix for connecting $V_{DD}$, ground and signals to selected ones of said pins during said test period.

8. Apparatus as in claim 7 wherein said means for successively measuring comprises an ammeter connected between said switching matrix and said means for applying $V_{DD}$ or ground.

9. Apparatus for testing an integrated circuit to detect defects, said apparatus comprising means for applying test signals to said circuit, means for successively measuring the values of $I_{DDQ}$ in said circuit in response to said applied test signals, means for processing said values of $I_{DDQ}$ to measure the amplitude of noise signals therein, and means for detecting whether or not said circuit contains defects based on the amplitude of said noise signals.

10. A method of testing an integrated circuit to detect defects, said method comprising the steps of applying test signals to said circuit, succesively measuring the values of $I_{DDQ}$ in said circuit in response to said applied test signals, processing said values of $I_{DDQ}$ to measure the amplitude of noise signals therein, and determining whether or not said circuit contains defects based on the amplitude of said noise signals.

11. A method as in claim 2 wherein said noise-representative signal is calculated utilizing Fourier analysis.

* * * * *